(12) United States Patent
Zhou et al.

(10) Patent No.: US 8,633,401 B2
(45) Date of Patent: Jan. 21, 2014

(54) SOLDERING PAD

(75) Inventors: Hua-Li Zhou, Shenzhen (CN);
Chia-Nan Pai, New Taipei (TW);
Shou-Kuo Hsu, New Taipei (TW)

(73) Assignees: Hong Fu Jin Precision Industry (ShenZhen) Co., Ltd, Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 100 days.

(21) Appl. No.: 13/217,626

(22) Filed: Aug. 25, 2011

(65) Prior Publication Data
US 2012/0273254 A1    Nov. 1, 2012

(30) Foreign Application Priority Data
Apr. 27, 2011    (CN) .......................... 2011 1 0106783

(51) Int. Cl.
*H05K 1/11*    (2006.01)
(52) U.S. Cl.
USPC .......................................... 174/267; 174/255

(58) Field of Classification Search
USPC ............. 174/145, 126.4, 255, 258, 267, 528, 174/534, 538; 361/743, 767, 760, 772, 773, 361/774, 777, 808; 29/846; 438/611
See application file for complete search history.

(56) References Cited

U.S. PATENT DOCUMENTS

| | | | |
|---|---|---|---|
| 7,129,570 B2 * | 10/2006 | Meyer-Berg | 257/678 |
| 7,169,647 B2 * | 1/2007 | Trovarelli et al. | 438/118 |
| 8,304,665 B2 * | 11/2012 | Chang et al. | 174/262 |
| 2003/0067755 A1 * | 4/2003 | Haimerl et al. | 361/773 |
| 2006/0246702 A1 * | 11/2006 | Kim et al. | 438/611 |

* cited by examiner

*Primary Examiner* — Boris Chervinsky
*Assistant Examiner* — Pete Lee
(74) *Attorney, Agent, or Firm* — Altis Law Group, Inc.

(57) ABSTRACT

A pad includes a first mating section and a second mating section. The first mating section includes a first horizontal plane and a first inclined plane. The second mating section includes a second horizontal plane and a second inclined plane. The first mating section is a copper foil capable of being connected to a wire. The second mating section is made of insulating material. The first inclined plane and the second inclined plane are bonded together.

11 Claims, 5 Drawing Sheets

SOLDERING PAD

BACKGROUND

1. Technical Field

The present disclosure relates to a soldering pad.

2. Description of Related Art

Soldering pads on circuit boards are used to connect electronic components to the circuit boards and thereby enabling a circuit to perform certain functions. FIG. 1 is a schematic view of a conventional soldering pad. As shown in FIG. 1, a conventional soldering pad 1 is disposed on a circuit board. When an electronic component is disposed on the soldering pad 1, the signals from the electronic component are transmitted to a wire 2 connected to the soldering pad 1 through the pin of the electronic component and the soldering pad 1, thereby outputting the signals. Because of impedance mismatch, signal reflection would occur. For example, arrow A represents the direction in which a signal enters the soldering pad 1, arrow B represents the direction in which the signal is reflected, arrow C represents the direction in which the signal is outputted. Because the reflected direction B is opposite to the incident direction A of the signal, a strong reflection signal is produced. As a result, the quality of the transmitted signal is affected. FIG. 2 is a curve diagram of a simulation of the pad of FIG. 1. As shown in FIG. 2, the impedance obtained by the simulation of the pad of FIG. 1 represents the reflection of the signal, wherein the radius of the soldering pad 1 is 7 mil. Thus, there is room for improvement in the art.

BRIEF DESCRIPTION OF THE DRAWINGS

Many aspects of the present disclosure can be better understood with reference to the following drawing(s). The components in the drawing(s) are not necessarily drawn to scale, the emphasis instead being placed upon clearly illustrating the principles of the present disclosure. Moreover, in the drawing(s), like reference numerals designate corresponding parts throughout the several views.

DETAILED DESCRIPTION

Figure 3:
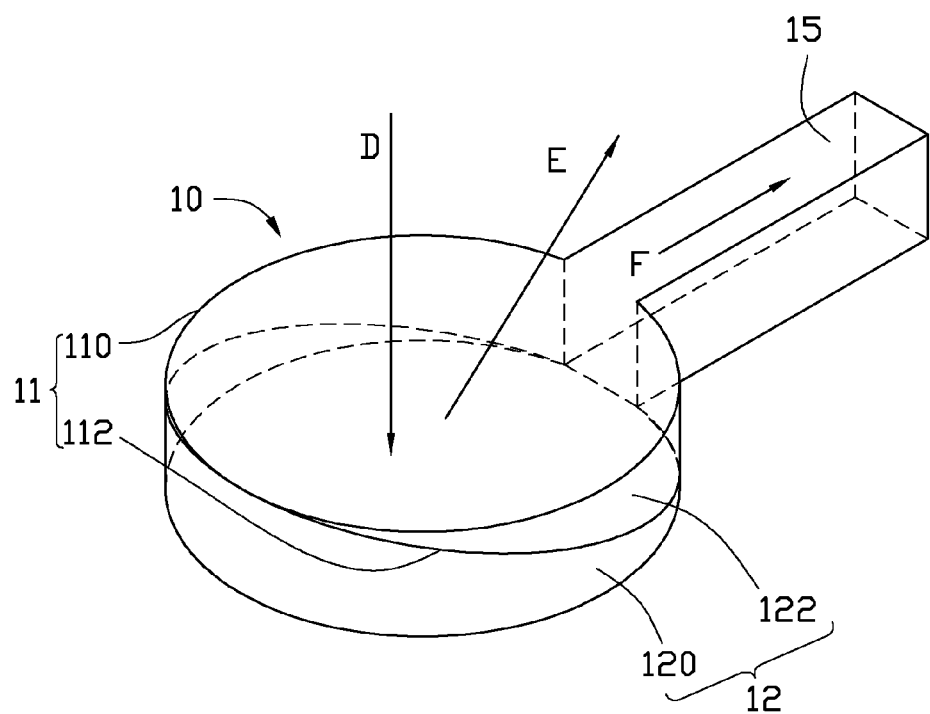
FIG. 3 is a schematic view of a first embodiment of a pad of the present disclosure.

FIG. 3 is a schematic view of a first embodiment of a pad of the present disclosure. As shown in FIG. 3, a pad 10 includes a first mating section 11 and a second mating section 12.

The first mating section 11 includes a first horizontal plane 110 and a first inclined plane 112. An angle between the first horizontal plane 110 and the first inclined plane 112 is 30 degrees. However, in other embodiments, the angle can be changed as needed. The first horizontal plane 110 has a circular shape. The first inclined plane 112 has an elliptical shape. The second mating section 12 has a structure similar to the first mating section 11 including a second horizontal plane 120 and a second inclined plane 122. The first mating section 11 is a copper foil. The first horizontal plane 110 has tin and solder resistance plated thereon. The second mating section 12 is made of insulating material such as FR4.

In this embodiment, the first inclined plane 112 of the first mating section 11 and the second inclined plane 122 of the second mating section 12 are parallel flat surfaces which are bound together. The first horizontal plane 110 of the first mating section 11 is parallel to the second horizontal plane 120 of the second mating section 12, such that the first mating section 11 and the second mating section 12 jointly form a cylinder. Therefore, both of the first mating section 11 and the second mating section 12 are cylindrical segments. In addition, the first horizontal plane 110 of the first mating section 11 is a first projected plane of the first inclined plane 112 of the first mating section 11, and the second horizontal plane 120 of the second mating section 12 is a second projected plane of the second inclined plane 122 of the second mating section 12. However, in other embodiments, the first inclined plane 112 and the second inclined plane 122 can be non-parallel surfaces, have other shapes, or defining a distance therebetween. The first mating section 11 and the second mating section 12 can jointly form a pillar of other shapes such as a prism.

The first mating section 11 is capable of being connected to a wire 15, thereby outputting a signal from the first mating section 11. In the embodiment, the first mating section 11 is laterally connected to the wire.

Figure 1:
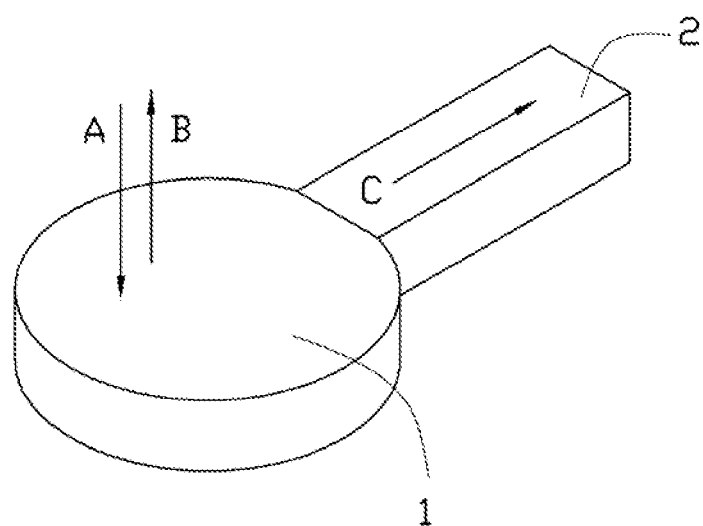
FIG. 1 is a schematic view of a conventional soldering pad.

If an electronic component is disposed on the pad 10 through surface mount technology (SMT), most of the signals output from the pin of the electronic component are reflected through the first inclined plane 112 of the first mating section 11. Since an angle is kept between the first horizontal plane 110 and the first inclined plane 112 of the first mating section 11, the reflective direction and the incident direction of the signal will not be on a same line. As shown in FIG. 3, arrow D represents the incident direction of the signal from the pin of the electronic component, arrow E represents the reflective direction of the signal from the first inclined plane 112, arrow F represents the output direction of the signal. That is, the reflective direction E of the signal is not on a same line with the incident direction D thereof. In comparison with the signal shown in FIG. 1 which has a difference of 180 degrees between the reflective direction and the incident direction of the signal, the signal shown in FIG. 2 has the reflective direction not on a same line with the incident direction. Consequently, the problem of the degradation of signals caused by the mis-match impedance of the pad and the pin of the electronic component is reduced.

Figure 2:
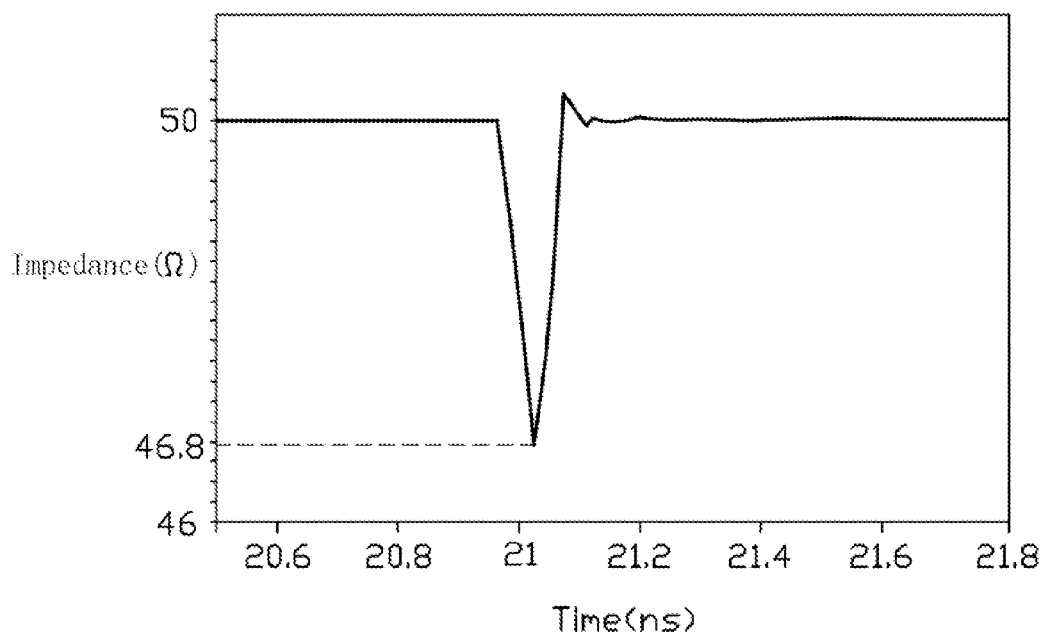
FIG. 2 is a curve diagram obtained by simulating the pad of FIG. 1.
Figure 4:
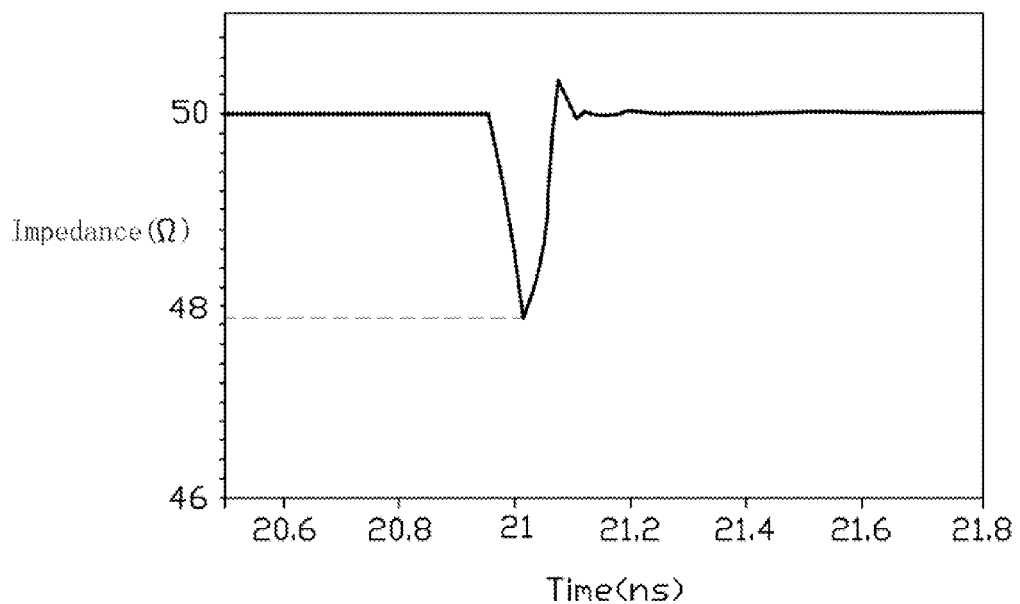
FIG. 4 is a curve diagram obtained by simulating the pad of FIG. 3.

FIG. 4 is a schematic view of simulating the pad of FIG. 3, wherein the radius of the pad 10 is 7 mil. As shown in FIG. 4, the impedance matching between the pad 10 and the wire 15 is better than that between the pad 1 and the wire 2 shown in FIG. 2. In FIG. 2 and FIG. 4, the straight line represents the impedance of the wire 2 and the wire 15, respectively, and the V-shaped line represents the impedance of the pad 1 and the pad 10, respectively.

Figure 5:
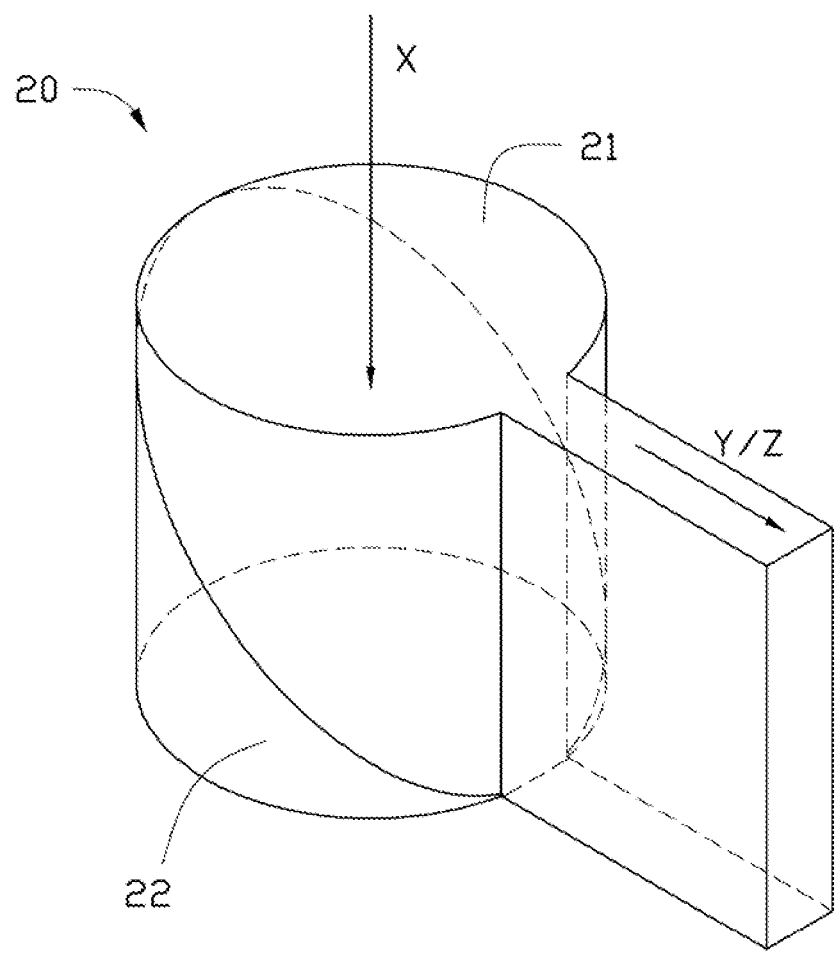
FIG. 5 is a schematic view of a second embodiment of a pad of the present disclosure.

FIG. 5 is a schematic view of a second embodiment of a pad of the present disclosure. As shown in FIG. 5, a pad 20 includes a first mating section 21 and a second mating section 22. Arrow X represents the incident direction of a signal, arrow Y represents the reflective direction of the signal, and arrow Z represents the output direction of the signal. The pad 20 has a structure similar to the pad 10 shown in FIG. 3, except the included angle between the horizontal plane and the inclined plane of the first mating section 21 of the pad 20 is 45 degrees, such that the reflective direction of the signal is the same as the output direction thereof. In comparison with the signal shown in FIG. 1 which has a difference of 180 degrees between the reflective direction and the incident direction of the signal, and the signal shown in FIG. 2 which the reflective direction and the incident direction of the signal are on a same line, the coincidence between the reflective direction and the output direction of the signal enormously enhances the reflection of the pad 10. Consequently, the problem of the degradation of signals caused by the mis-match impedance of the pad and the pin of the electronic component is further reduced.

The disclosed pads 10 and 20 enormously enhance the reflections of the signals through their structures, thereby ensuring the quality of the signals transmitted through the disclosed pads 10 and 20 and the wire 15.

While the disclosure has been described by way of example and in terms of preferred embodiment, it is to be understood that the disclosure is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A pad, comprising: a first mating section connecting to a wire and including a first horizontal plane and a first inclined plane inclined inwardly relative to the first horizontal plane wherein the first horizontal plane is a first projected plane of the first inclined plane and wherein the first mating section is a copper foil; and a second mating section including a second horizontal plane and a second inclined plane inclined relative to the second horizontal plane, wherein the second mating section is made of insulating material, the first inclined plane is opposite to the second inclined plane.

2. The pad of claim 1, wherein an included angle between the first horizontal plane and the first inclined plane is substantially 45 degrees.

3. The pad of claim 1, wherein the first inclined plane is substantially parallel to the second inclined plane.

4. The pad of claim 3, wherein the first inclined plane and the second inclined plane are flat surfaces opposite to each other.

5. The pad of claim 1, wherein the first inclined plane and the second inclined plane are bonded together.

6. The pad of claim 1, wherein the first horizontal plane is substantially parallel to the second horizontal plane.

7. The pad of claim 1, wherein the first mating section and the second mating section jointly form a pillar.

8. The pad of claim 7, wherein the pillar is a cylinder.

9. The pad of claim 1, wherein the first mating section is laterally connected to the wire.

10. The pad of claim 1, wherein the first inclined plane inclined relative to the first horizontal plane reflects a signal received from the first mating section, and an incident direction and a reflective direction of the signal are on separate lines.

11. The pad of claim 1, wherein the first mating section is a half of a cylinder, and the second mating section is the other half of the cylinder.

* * * * *